United States Patent
Ning (10) Patent No.: US 11,521,661 B2
(45) Date of Patent: Dec. 6, 2022

(54) SEMICONDUCTOR DEVICE

(71) Applicant: CHANGXIN MEMORY TECHNOLOGIES, INC., Hefei (CN)

(72) Inventor: Shuliang Ning, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/389,629

(22) Filed: Jul. 30, 2021

(65) Prior Publication Data

US 2022/0020400 A1      Jan. 20, 2022

Related U.S. Application Data

(63) Continuation of application No. PCT/CN2020/136388, filed on Dec. 15, 2020.

(30) Foreign Application Priority Data

Jul. 17, 2020   (CN) .......................... 202010689682.7

(51) Int. Cl.
    *G11C 7/04*      (2006.01)
    *G11C 11/406*   (2006.01)
    (Continued)

(52) U.S. Cl.
    CPC .................. *G11C 7/04* (2013.01); *G11C 5/04* (2013.01); *G11C 11/40626* (2013.01);
    (Continued)

(58) Field of Classification Search
    CPC ....... G11C 7/04; G11C 5/04; G11C 11/40626; G11C 29/028; H01L 23/34; H01L 25/0657; H01L 2225/06589
    See application file for complete search history.

(56) References Cited

U.S. PATENT DOCUMENTS 7,107,178 B2 *  9/2006  Won ....................... G01K 3/005
                                                        377/25
7,266,031 B2 *  9/2007  Kim ........................ G11C 7/04
                                                    365/230.06
(Continued)

FOREIGN PATENT DOCUMENTS

CN      101017708 A     8/2007
CN      101162604 A     4/2008
(Continued)

OTHER PUBLICATIONS

International Search Report in the international application No. PCT/CN2020/136390, dated Apr. 16, 2021, 2 pgs.
(Continued)

*Primary Examiner* — Tri M Hoang
(74) *Attorney, Agent, or Firm* — Cooper Legal Group, LLC (57) ABSTRACT

A semiconductor device is provided, which includes a memory chip and a temperature detection module. The temperature detection module is configured to detect a temperature of the memory chip. The temperature detection module includes a temperature detection unit. The temperature detection unit includes a temperature sensitive unit and an adjustable resistor unit. An electrical conductivity of the temperature sensitive unit changes with the change of temperature, and the adjustable resistor unit being connected in parallel with the temperature sensitive unit. The temperature detection unit is configured to be calibrated by adjusting a resistance value of the adjustable resistor unit.

20 Claims, 7 Drawing Sheets

(51) Int. Cl.
  *G11C 5/04* (2006.01)
  *H01L 23/34* (2006.01)
  *H01L 25/065* (2006.01)
(52) U.S. Cl.
  CPC .......... *H01L 23/34* (2013.01); *H01L 25/0657* (2013.01); *H01L 2225/06589* (2013.01)

(56) References Cited

U.S. PATENT DOCUMENTS

| | | |
|---|---|---|
| 7,383,149 B1 | 6/2008 | Walker |
| 7,480,588 B1 | 1/2009 | Walker |
| 7,554,869 B2 | 6/2009 | Kim |
| 7,606,099 B2 | 10/2009 | Chung |
| 7,643,889 B2 | 1/2010 | Jeong |
| 8,801,279 B2 | 8/2014 | Kim |
| 9,013,932 B1 | 4/2015 | Lee |
| 9,194,754 B2 | 11/2015 | Walker |
| 9,465,757 B2 | 10/2016 | Son et al. |
| 9,520,189 B1 | 12/2016 | Papandreou et al. |
| 9,530,766 B2 | 12/2016 | Ishihara et al. |
| 9,587,994 B2 | 3/2017 | Yayama |
| 9,927,986 B2 | 3/2018 | Hodes et al. |
| 10,679,711 B2 | 6/2020 | Matsumoto |
| 2005/0105367 A1 | 5/2005 | Kim |
| 2005/0146965 A1 | 7/2005 | Kim |
| 2006/0066384 A1 | 3/2006 | Jain |
| 2006/0290366 A1 | 12/2006 | Kon |
| 2007/0247944 A1 | 10/2007 | Fischer |
| 2008/0018377 A1 | 1/2008 | Chung |
| 2008/0091378 A1 | 4/2008 | Jeong |
| 2009/0085647 A1* | 4/2009 | Hwang ................ G11C 7/1051 327/513 |
| 2011/0279168 A1 | 11/2011 | Lee |
| 2013/0060499 A1 | 3/2013 | Yoshimura |
| 2015/0043266 A1 | 2/2015 | Youn |
| 2015/0124544 A1 | 5/2015 | Lee |
| 2016/0133314 A1 | 5/2016 | Hwang et al. |
| 2016/0141284 A1 | 5/2016 | Ishihara et al. |
| 2018/0166123 A1 | 6/2018 | Goto et al. |
| 2018/0293029 A1 | 10/2018 | Achtenberg et al. |
| 2019/0096473 A1 | 3/2019 | Park |
| 2019/0295663 A1 | 9/2019 | Matsumoto |
| 2020/0142799 A1 | 5/2020 | Hiruta |
| 2020/0159465 A1 | 5/2020 | Achtenberg et al. |
| 2020/0333194 A1 | 10/2020 | Huh |
| 2021/0247241 A1* | 8/2021 | Nagata ..................... G01K 7/20 |
| 2021/0362492 A1 | 11/2021 | Gardner et al. |
| 2022/0006427 A1* | 1/2022 | Sugimoto ............... H03F 3/245 |

FOREIGN PATENT DOCUMENTS

| | | |
|---|---|---|
| CN | 104807561 A | 7/2015 |
| CN | 105474543 A | 4/2016 |
| CN | 107393577 A | 11/2017 |
| CN | 208953151 U | 6/2019 |
| CN | 110299171 A | 10/2019 |
| CN | 212303077 U | 1/2021 |
| CN | 212303078 U | 1/2021 |
| CN | 212303079 U | 1/2021 |

OTHER PUBLICATIONS

International Search Report in the international application No. PCT/CN2020/136391, dated Apr. 16, 2021, 2 pgs.
International Search Report in the international application No. PCT/CN2020/136388, dated Apr. 8, 2021, 3 pgs.
Supplementary European Search Report in the European application No. 20937168.1, dated Jun. 13, 2022, 8 pgs.
First Office Action of the U.S. Appl. No. 17/389,618, dated Apr. 11, 2022, 24 pgs.
Notice of Allowance of the U.S. Appl. No. 17/389,636, dated May 4, 2022, 19 pgs.

* cited by examiner

SEMICONDUCTOR DEVICE

CROSS-REFERENCE TO RELATED APPLICATION

This application is a continuation application of International Patent Application No. PCT/CN2020/136388, filed on Dec. 15, 2020 and entitled "Semiconductor Device", which claims priority to Chinese patent application No. 202010689682.7, filed on Jul. 17, 2020 and "entitled "Semiconductor Device". The contents of Patent Application No. PCT/CN2020/136388 and Chinese patent application No. 202010689682.7 are hereby incorporated by reference in their entireties.

TECHNICAL FIELD

The disclosure relates to the field of memories, and particularly relates to a semiconductor device.

BACKGROUND

Dynamic Random Access Memory (DRAM) is a commonly used semiconductor memory in computers, and a memory array region of the DRAM consists of many duplicated memory cells. Each of the memory cells usually includes a capacitor and a transistor. A grid electrode of the transistor is connected with a word line, a drain electrode of the transistor is connected with a bit line, a source electrode of the transistor is connected with the capacitor. Voltage signals on the word line may control the transistor to be turned on or turned off, so that the data information stored in the capacitor may be read through the bit line, or the data information may be written into the capacitor through the bit line for storage.

The temperature has a greater influence on memory writing. When a memory is written in a low-temperature environment, the writing time is longer, and the writing stability is not high.

SUMMARY

The technical problem to be solved by the disclosure is to provide a semiconductor device which may detect the temperature of a memory chip to prevent the memory chip from being enabled and run at a low temperature, shorten the writing time and improve the writing stability of the memory chip, and simultaneously may calibrate a temperature detection unit to improve the detection accuracy of the temperature detection unit.

In order to solve the above problem, the disclosure provides a semiconductor device, including a memory chip and a temperature detection module. The temperature detection module is configured to detect a temperature of the memory chip. The temperature detection module includes a temperature detection unit, and the temperature detection unit includes a temperature sensitive unit and an adjustable resistor unit. An electrical conductivity of the temperature sensitive unit changes with the change of temperature. The adjustable resistor unit is connected in parallel with the temperature sensitive unit. The temperature detection unit is configured to be calibrated by adjusting a resistance value of the adjustable resistor unit.

Further, the adjustable resistor unit includes multiple sub-resistors and multiple switches. The sub-resistors are connected in series, and each of the switches is connected in parallel with at least one of the sub-resistors. The resistance value of the adjustable resistor unit is changed by changing switching-on and switching-off of the multiple switches.

Further, resistance values of the sub-resistors are the same.

Further, each of the sub-resistors is a polysilicon resistor or a N-type diffused resistor or a P-type diffused resistor.

Further, the sub-resistors are electrically connected with each other through a first layer of metal wires, and the sub-resistors are electrically connected with the switches through a second layer of metal wires.

Further, the temperature detection unit further includes a fixed resistor, and the fixed resistor is connected in series with the temperature sensitive unit. The fixed resistor is provided with a first end and a second end, the first end of the fixed resistor is electrically connected with a power supply, and the second end of the fixed resistor is electrically connected with the temperature sensitive unit.

Further, the temperature sensitive unit is a diode, a positive end of the diode is electrically connected with the second end of the fixed resistor, and a negative end of the diode is electrically connected with a grounding terminal.

Further, the adjustable resistor unit includes a first end and a second end. The sub-resistors are disposed between the first end of the adjustable resistor unit and the second end of the adjustable resistor unit. The first end of the adjustable resistor unit is electrically connected with the grounding terminal, and the second end of the adjustable resistor unit is electrically connected with the second end of the fixed resistor.

Further, the temperature detection module further includes an Analog/Digital (A/D) conversion module having an input end and an output end. The input end is electrically connected with the second end of the fixed resistor, the output end outputs digital signals, and the A/D conversion module is configured to convert analog signals of the second end of the fixed resistor into digital signals.

Further, the A/D conversion module includes: a resistor unit provided with a first end and a second end, the first end of the resistor unit being electrically connected with a power supply, the second end of the resistor unit being electrically connected with the grounding terminal, the resistor unit being provided with multiple leading-out terminals, and the voltages of respective leading-out terminals being different from each other; and multiple comparison units, signals of the input end of the A/D conversion module serving as input signals of the comparison units, signals of the respective multiple leading-out terminals of the resistor unit serving as reference signals of the respective multiple comparison units, and the comparison units outputting digital signals.

Further, the A/D conversion module includes an encoding unit, and the encoding unit receives and encodes the digital signals of the comparison units.

Further, the A/D conversion module includes an output unit, and the output unit is connected with the comparison units to output the digital signals.

Further, the resistor unit includes multiple sub-resistors connected in series, and the numbers of the sub-resistors between the respective leading-out terminals of the resistor unit and the second end of the resistor unit are different from each other, so that the voltages of the respective leading-out terminals are different from each other.

Further, resistance values of the respective sub-resistors are the same or different from each other.

Further, the numbers of the sub-resistors between the respective leading-out terminals of the resistor unit and the second end of the resistor unit are progressively increased by a preset value.

Further, each of the sub-resistors is at least one of a polysilicon resistor, a N-type diffused resistor or a P-type diffused resistor.

Further, the sub-resistors are electrically connected with each other through a first layer of metal wires, and the resistor unit forms the leading-out terminals through a second layer of metal wires.

Further, the temperature detection unit and the memory chip are powered by different power supplies.

Further, the temperature detection unit is powered earlier than the memory chip.

Further, the semiconductor device includes a control chip, and the memory chip and the temperature detection module are electrically connected with the control chip.

Further, the control chip is configured to heat the memory chip before the memory chip is enabled and to judge whether the temperature detected by the temperature detection unit reaches a set threshold, and to control the memory chip to be enabled if the temperature detected by the temperature detection unit reaches the set threshold.

The disclosure has the following advantages. The temperature detection module is configured to detect the temperature of the memory chip, and the temperature detected by the temperature detection module provides a reference for enabling and running the memory chip, thereby preventing the memory chip from being enabled and run at a low temperature, shortening the writing time, and improving the writing stability of the memory chip. In addition, the circuit structure of the temperature detection module of the disclosure is simple and easy to implement, the temperature detection module occupies a small area, and the temperature detection unit is calibrated to improve the detection accuracy of the temperature detection unit.

DETAILED DESCRIPTION

The embodiments of a semiconductor device provided in the disclosure will be described in detail below with reference to the accompanying drawings.

As mentioned in the background, the temperature has a greater influence on memory writing. When a memory is written in a low-temperature environment, the writing time is longer, and the writing stability is not high.

Researches show that, when an existing memory works in a low-temperature environment, a temperature drop may increase resistance of a bit line, word line, metal connecting wire (metal contact portion), etc., in the memory, and increase of the resistance may change or prolong time for writing data into the memory, influencing the writing stability of the memory.

Therefore, the disclosure provides a semiconductor device which uses the temperature detection module to detect the temperature of the memory chip so as to provide a reference for enabling and running the memory chip, thereby preventing the memory chip from being enabled and run at a low temperature, shortening the writing time, and improving the writing stability of the memory chip. Furthermore, the semiconductor device of the disclosure may further calibrate the temperature detection unit to improve the accuracy of temperature detection.

Figure 1:
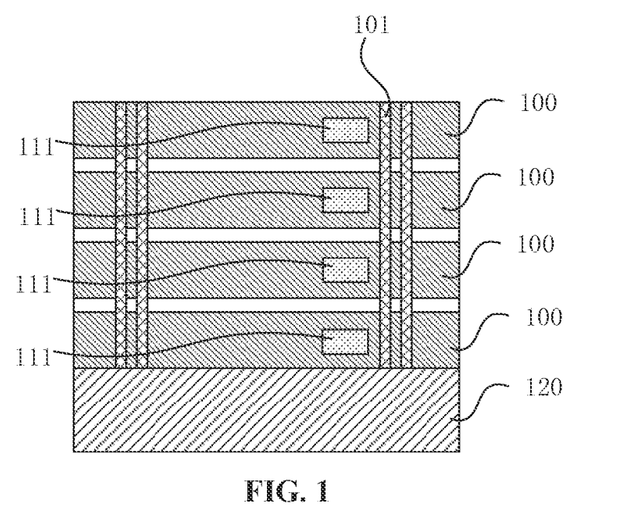
FIG. 1 is a schematic structural diagram of a semiconductor device according to a first embodiment of the disclosure.
Figure 2:
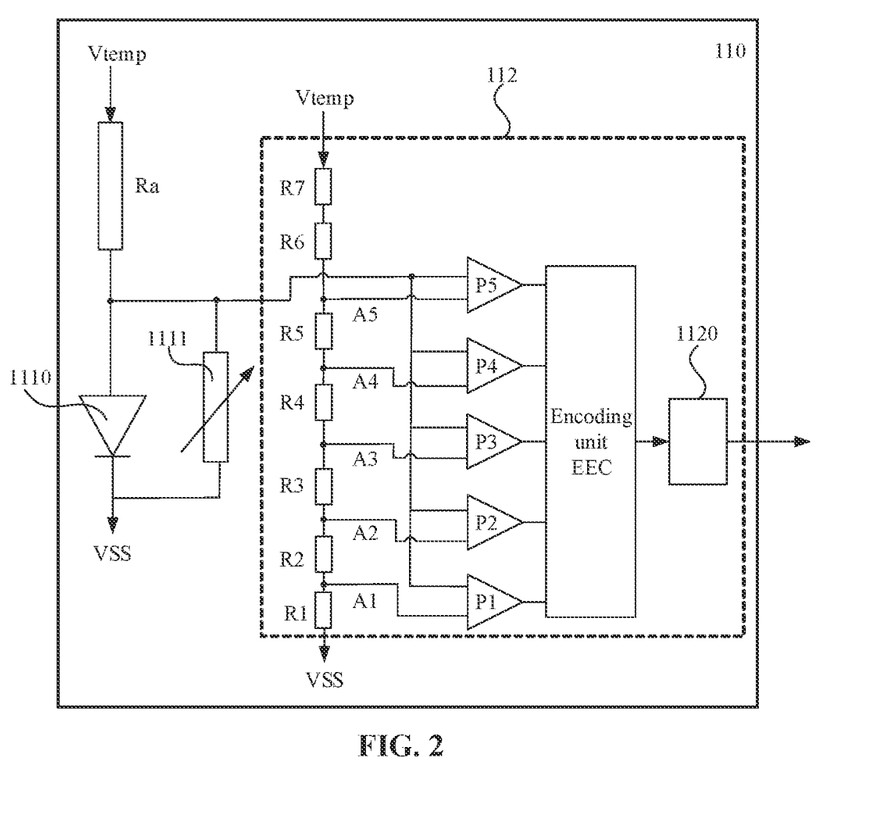
FIG. 2 is a circuit diagram of a temperature detection module in a semiconductor device of the disclosure.

FIG. 1 is a schematic structural diagram of a semiconductor device according to a first embodiment of the disclosure. FIG. 2 is a circuit diagram of a temperature detection module in a semiconductor device of the disclosure. Referring to FIG. 1 and FIG. 2, the semiconductor device of the disclosure includes a memory chip 100 and a temperature detection module 110.

The semiconductor device further includes a control chip 120, and the memory chip 100 and the temperature detection module 110 are electrically connected with the control chip 120. The control chip 120 is configured to control enabling and running of the memory chip 100 and the temperature detection module 110. Enabling of the memory chip 100 includes power-on and self-detection, and running of the memory chip 100 may include writing data into the memory chip 100, reading data from the memory chip 100, deleting data stored in the memory chip 100, etc.

The memory chip 100 is an existing memory where data writing, data read and/or data deletion may be performed, and the memory chip 100 is formed by a semiconductor integration manufacturing process. Specifically, the memory chip 100 may include a memory array and a peripheral circuit connected with the memory array. The memory array includes multiple memory cells and a bit line, word line and metal connecting wire (metal contact portion) connected with the memory cells. The memory cell is configured to store data, and the peripheral circuit is a related circuit when the memory array is operated. In the embodiment, the memory chip 100 is a DRAM chip, and the DRAM chip includes multiple memory cells. The memory cell usually includes a capacitor and a transistor, a gate electrode of the transistor is connected with a word line, a drain electrode is connected with a bit line, and a source electrode is connected with the capacitor. In another embodiment, the memory chip 100 may be an another type of memory chip.

The temperature detection module 110 is configured to detect a temperature of the memory chip 100 and to supply a signal to the control chip 120. When the temperature detected by the temperature detection module 110 reaches a set threshold, the control chip 120 controls the memory chip 100 to be enabled. A specific magnitude of the set threshold may be set according to a practical requirement or experiences.

The temperature detection module 110 includes a temperature detection unit 111. The temperature detection unit 111 includes a temperature sensitive unit 1110 and an adjustable resistor unit 1111.

The temperature sensitive unit 1110 is configured to detect the temperature of the memory chip 100, and the electrical conductivity of the temperature sensitive unit 1110 changes with the change of temperature. In the present embodiment, the temperature sensitive unit 1110 is a diode, and the diode is sensitive to temperature. As the temperature of the ambient environment of the diode changes, the current of the diode changes. By measuring the voltage of the diode, the temperature corresponding to the voltage is obtained, so that the temperature of the ambient environment may be measured.

The adjustable resistor unit 1111 is connected in parallel with the temperature sensitive unit 1110. The temperature detection unit 111 is configured to be calibrated by adjusting a resistance value of the adjustable resistor unit 1111. Specifically, the resistance value of the adjustable resistor unit 1111 is changed under the control of the control chip 120, and then, the output voltage of the positive end of the diode is changed, so that the calibration of the diode may be realized.

Figure 3:
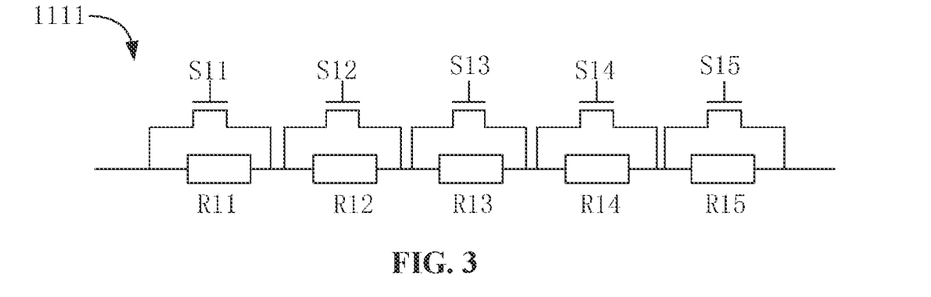
FIG. 3 is a circuit diagram of an adjustable resistor unit of the semiconductor device according to the first embodiment of the disclosure.

The present embodiment enumerates a circuit structure of the adjustable resistor unit 1111. FIG. 3 is a circuit diagram of an adjustable resistor unit 1111 according to an embodiment. The adjustable resistor unit 1111 includes multiple sub-resistors R1$n$ and multiple switches S1$n$. The sub-resistors R1$n$ are connected in series, and each of the switches S1$n$ is connected in parallel with at least one of the sub-resistors R1$n$. The resistance value of the adjustable resistor unit 1111 is changed by changing the switching-on and switching-off of the multiple switches S1$n$.

In the present embodiment, sub-resistors R11 to R15 and switches S11 to S15 are schematically shown. Each of the sub-resistors is connected in parallel with a switch. Specifically, the sub-resistor R11 is connected in parallel with the switch S11, the sub-resistor R12 is connected in parallel with the switch S12, the sub-resistor R13 is connected in parallel with the switch S13, the sub-resistor R14 is connected in parallel with the switch S14, and the sub-resistor R15 is connected in parallel with the switch S15. In other embodiments of the disclosure, two or more sub-resistors may be connected in series and then connected in parallel with a switch. For example, the sub-resistor R11 and the sub-resistor R12 are connected in series and then connected in parallel with the switch S11, or the sub-resistor R11, the sub-resistor R12 and the sub-resistor R13 are connected in series and then connected in parallel with the switch S11.

When the resistance value of the adjustable resistor unit 1111 needs to be changed, the switching-on and switching-off of the multiple switches S1$n$ are changed. When the resistance value of the adjustable resistor unit 1111 needs to be increased, the switch S1$n$ is switched off, so that the sub-resistor connected in parallel with the switch S1$n$ is connected to the circuit. When the resistance value of the adjustable resistor unit 1111 needs to be reduced, the switch S1$n$ is switched on, so that the switch S1$n$ is connected to the circuit, and the sub-resistor connected in parallel with the switch S1$n$ is switched off. For example, in the present embodiment, when the resistance value of the adjustable resistor unit 1111 needs to be increased, the switch S11 is switched off, so that the sub-resistor R11 connected in parallel with the switch S11 is connected to the circuit. When the resistance value of the adjustable resistor unit 1111 needs to be reduced, the switch S11 is switched on, so that the switch S11 is connected to the circuit, and the sub-resistor R11 connected in parallel with the switch S11 is short-circuited.

Further, in the present embodiment, the resistance values of the sub-resistors R1$n$ are the same, thereby simplifying the layout difficulty, being simple and easy to implement, and facilitating the manufacture. Each of the sub-resistors R1$n$ is a polysilicon resistor or a N-type diffused resistor or a P-type diffused resistor. Further, the sub-resistors R1$n$ are electrically connected with each other through a first layer of metal wires, and the sub-resistors R1$n$ are electrically connected with the switches S1$n$ through a second layer of metal wires. This manner may further facilitate the manufacture and improve the stability and accuracy.

Further, each of the switches S1$n$ may be a transistor, such as an N-channel Metal Oxide Semiconductor (NMOS) transistor or a P-channel Metal Oxide Semiconductor (PMOS) transistor, which has a stable structure and is easy to manufacture.

The foregoing is only an embodiment of the adjustable resistor unit 1111 provided by the disclosure. In other embodiments of the disclosure, other circuit structures may also be used to implement the adjustable resistor unit 1111.

Referring to FIG. 2, the temperature detection unit 111 further includes a fixed resistor Ra. The fixed resistor Ra is connected in series with the temperature sensitive unit 1110. Specifically, in the present embodiment, the temperature sensitive unit 1110 is a diode, a first end of the fixed resistor Ra is electrically connected with a power supply Vtemp, a second end of the fixed resistor Ra is connected with a positive end of the diode, and a negative end of the diode is electrically connected with a grounding terminal VSS.

Further, the adjustable resistor unit 1111 includes a first end and a second end, the sub-resistors R$n$ are disposed between the first end of the adjustable resistor unit and the second end of the adjustable resistor unit, the first end of the adjustable resistor unit 1111 is electrically connected with the grounding terminal VSS, and the second end of the adjustable resistor unit 1111 is electrically connected with the second end of the fixed resistor Ra.

According to the semiconductor device of the disclosure, the temperature detection unit 111 is calibrated by adjusting the resistance value of the adjustable resistor unit 1111, thereby ensuring the measurement accuracy and avoiding larger measurement errors.

The semiconductor device includes one or more memory chips 100, and the temperature detection module 110 includes one or more temperature detection units 111. The temperature detection unit 111 may be configured to detect temperatures of the one or more memory chips 100. The temperature detection unit 111 may form a one-to-one correspondence or a one-to-multiple correspondence with the memory chip 100.

When the number of the memory chip 100 is one and the number of the temperature detection unit 111 is also one, the temperature detection unit 111 and the memory chip 100 form the one-to-one correspondence, and the temperature detection unit 111 is only configured to detect the temperature of the memory chip 100.

When the number of the memory chips 100 is multiple, and the number of the temperature detection unit 111 is one, the temperature detection unit 111 and the memory chip 100 form the one-to-multiple correspondence, and the temperature detection unit 111 is configured to detect the temperatures of the multiple memory chips 100.

When the number of the memory chips 100 is multiple and the number of the temperature detection units 111 is also multiple, but the number of the temperature detection units 111 is smaller than the number of the memory chips 100, the temperature detection units 111 and the memory chips 100 may form both the one-to-one correspondence and the one-to-multiple correspondence, or only form the one-to-multiple correspondence. That is, there may be a case that one temperature sensitive unit 1110 detects the temperature of only one memory chip 100 and one temperature sensitive unit 1110 detects the temperatures of multiple memory chips 100, or there is only a case that one temperature sensitive unit 1110 detects the temperatures of multiple memory chips 100.

When the number of the memory chips 100 is multiple, the number of the temperature detection units 111 is also multiple, and the number of the temperature detection units 111 is the same as the number of the memory chips 100, the temperature detection units 111 and the memory chips 100 form the one-to-one correspondence, and one temperature detection unit 111 is configured to detect the temperature of one memory chip 100. Specifically, in the embodiment, the number of the memory chips 100 is multiple, and the number of the temperature detection units 111 is also multiple. As shown in FIG. 1, FIG. 1 schematically shows four memory chips 100 and four temperature detection units 111. The multiple memory chips 100 are stacked on each other, and each of the temperature detection units 111 correspond to the respective one of the memory chips 100.

Furthermore, the temperature detection unit 111 may be formed in the memory chip 100 through a semiconductor integration manufacturing process. The temperature detection unit 111 may be formed in the memory chip 100 if the temperature detection unit 111 is configured to detect the temperature of only one memory chip 100. For example, in the embodiment, as shown in FIG. 1, each of the temperature detection units 111 corresponds to the respective one of the memory chips 100, and one temperature detection unit 111 is arranged in each memory chip 100. The temperature detection unit 111, if configured to detect the temperatures of multiple memory chips 100, may be formed in any memory chip 100 in the multiple memory chips 100 or formed in the middle or bottom memory chip 100 of the multiple memory chips 100. For example, in a second embodiment of the disclosure, referring to FIG. 4, a structure diagram of a second embodiment of a semiconductor device according to the disclosure is shown. The temperature detection unit 111 is arranged in the bottom memory chip 100, and may detect temperatures of four memory chips 100.

In another embodiment of the disclosure, the temperature detection unit 111 is not arranged in the memory chip 100 but arranged in the control chip 120. Specifically, referring to FIG. 5, a structure diagram of a third embodiment of a semiconductor device according to the disclosure is shown. The temperature detection unit 111 is arranged in the control chip 120, and may measure temperatures of four memory chips 100 stacked on the control chip 120.

Figure 4:
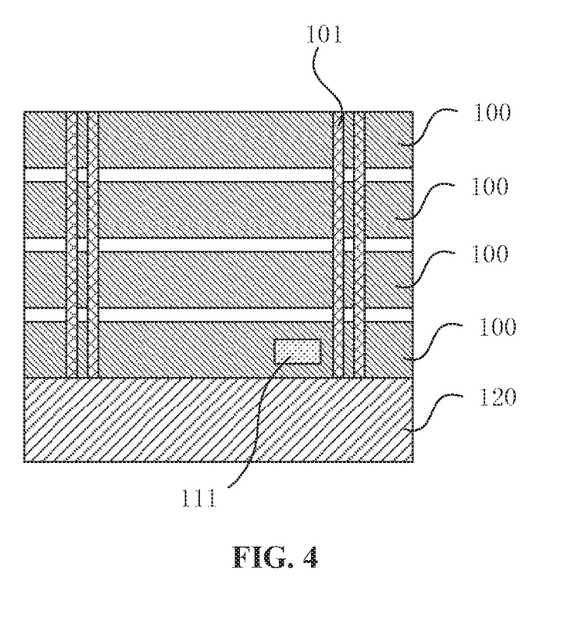
FIG. 4 is a schematic structural diagram of a semiconductor device according to a second embodiment of the disclosure.
Figure 5:
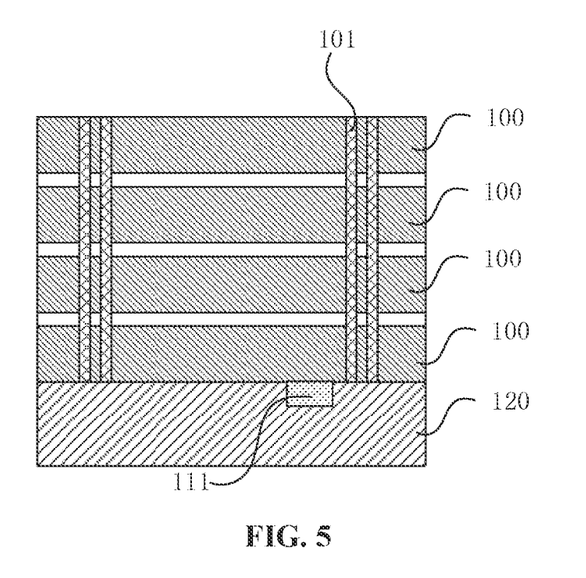
FIG. 5 is a schematic structural diagram of a semiconductor device according to a third embodiment of the disclosure.
Figure 6:
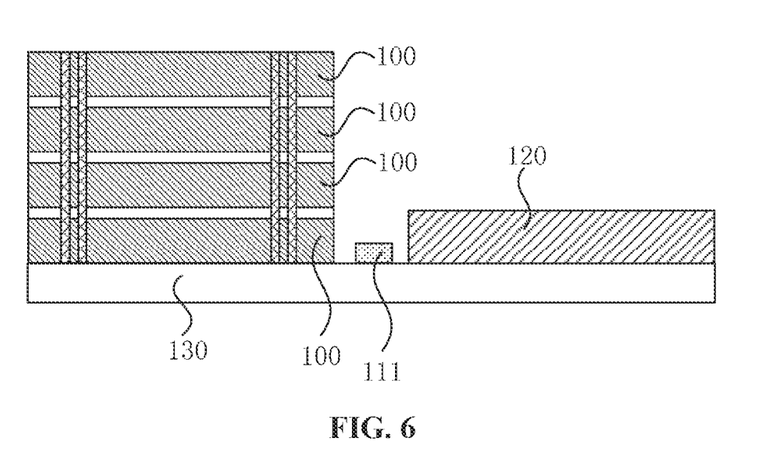
FIG. 6 is a schematic structural diagram of a semiconductor device according to a fourth embodiment of the disclosure.

In another embodiment of the disclosure, referring to FIG. 6, a structure diagram of a fourth embodiment of a semiconductor device according to the disclosure is shown. The semiconductor device further includes a circuit substrate 130, a connecting circuit (not shown in the figure) is formed in the circuit substrate 130. Both the memory chip 100 and the control chip 120 are arranged on the circuit substrate 130, and the memory chip 100 is electrically connected with the control chip 120 through the connecting circuit in the circuit substrate 130. In the embodiment, the temperature detection unit 111 is also arranged on the circuit substrate 130 to measure the ambient temperature, and the ambient temperature is approximate to the temperature of the memory chip 100, and may approximately be used as the temperature of the memory chip 100. The circuit substrate 130 includes, but not limited to, a Printed Circuit Board (PCB). It can be understood that, in another embodiment of the disclosure, the temperature detection unit 111 may not be arranged on the circuit substrate 130, and the temperature detection unit 111 may be arranged in the memory chip 100 or the control chip 120, as shown in FIG. 1, FIG. 4 and FIG. 5.

It is to be noted that, in the embodiment of the disclosure, functions of the control chip 120 in controlling enabling of the memory chip 100, etc., may also be realized by arranging a control circuit in the memory chip 100, and in such case, the control chip 120 may not be required. Those skilled in the art should understand that the control chip may be arranged as required.

Figure 7:
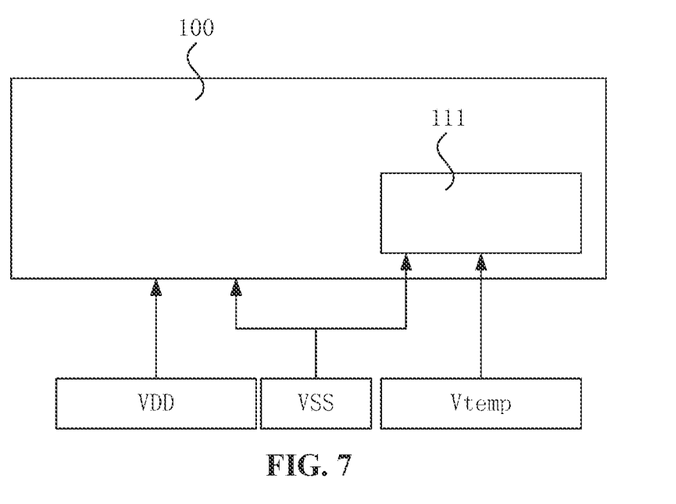
FIG. 7 is a schematic diagram showing electrical connection of the semiconductor device according to the first embodiment of the disclosure.

Furthermore, the temperature detection unit 111 and the memory chip 100 are powered by different power supplies. FIG. 7 is a schematic diagram showing electrical connection of a first embodiment of a semiconductor device according to the disclosure. Referring to FIG. 7, the temperature detection unit 111 is powered by the power supply Vtemp, and the memory chip 100 is powered by the power supply VDD. The grounding terminal VSS, the power supply VDD and the power supply Vtemp are provided by the control chip 120. Since the temperature detection unit 111 and the memory chip 100 are powered by different power supplies, power supply to the temperature detection unit 111 and the memory chip 100 may be controlled independently of each other to enable the temperature detection unit 111 and the memory chip 100 at different time.

Accordingly, in the disclosure, the temperature detection unit 111 and the memory chip 100 may be controlled to be enabled independently of each other. That is, the temperature detection unit 111 may be enabled no matter whether the memory chip 100 is enabled, so that the temperature of the memory chip 100 may be detected no matter whether the memory chip 100 is enabled, a reference may be provided for enabling and running the memory chip 100, the memory chip 100 may further be prevented from being enabled or run at a low temperature, and the stability of the memory chip 100 is improved.

As described above, the temperature greatly influences the performance of the memory chip 100, particularly when the memory chip 100 is enabled. If the memory chip 100 is enabled at a low temperature, time for writing data into the memory chip 100 may be changed (for example, increased), which influences the writing stability of the memory chip 100. Therefore, the temperature of the memory chip 100 is required to be measured before the memory chip 100 is enabled to ensure that the memory chip 100 may be enabled at an approximate temperature.

Therefore, in the disclosure, the temperature detection unit 111 is powered earlier than the memory chip 100. That is, the temperature detection unit 111 has been enabled before the memory chip 100 is enabled, and in such a manner, a temperature of the memory chip 100 before being enabled may be obtained to provide a reference for enabling the memory chip 100. A power supply time difference between the temperature detection unit 111 and the memory chip 100 is determined by a temperature change rate of the memory chip 100. If the temperature change rate of the memory chip 100 is high, time for the memory chip 100 to reach a preset temperature is short, so that the power supply time difference between the temperature detection unit 111 and the memory chip 100 is small. If the temperature change rate of the memory chip 100 is low, the time for the memory chip 100 to reach the preset temperature is long, so that the power supply time difference between the temperature detection unit 111 and the memory chip 100 is great.

Further, referring to FIG. 7, the temperature detection unit 111 and the memory chip 100 share the same grounding terminal VSS. This provides the following advantages. On one hand, increase of a leakage current in a case that the memory chip 100 is not enabled may be avoided. On the other hand, the number of pins may be reduced, and the space is saved.

Referring back to FIG. 1, the multiple memory chips 100 are stacked on the control chip 120, and the control chip 120 is bonded with the bottom memory chip 100 in the stacked structure. In another embodiment of the disclosure, when there is only one memory chip 100, the memory chip 100 is arranged on the control chip 120, and the control chip 120 is bonded with the memory chip 100.

A through-silicon-via interconnect structure 101 is formed in the memory chip 100. Through the through-silicon-via interconnect structure 101, the memory chip 100 is electrically connected with the control chip 120, and the temperature detection unit 111 is electrically connected with the control chip 120. That is, through the through-silicon-via interconnect structure 101, the memory chip 100 is electrically connected with the grounding terminal VSS and the power supply VDD, and the temperature detection unit 111 is electrically connected with the power supply Vtemp and the grounding terminal VSS. Specifically, in the embodiment, when multiple memory chips 100 are stacked on each other, each of the memory chips 100 may be connected with the control chip 120 through the respective one of different silicon-through-via interconnect structures. When there are multiple temperature detection units 111, each of the temperature detection units 111 may be connected with the control chip 120 through the respective one of different through-silicon-via interconnect structures, or the multiple temperature detection units 111 may be connected with the control chip 120 through the same silicon-through-via interconnect structure. It can be understood that the memory chip 100 and the temperature detection unit 111 are connected with the control chip 120 through different silicon-through-via interconnect structures, such that the temperature detection unit 111 and the memory chip 100 may be powered by different power supplies. Furthermore, the multiple temperature detection units 111 may also share the same silicon-through-via interconnect structure for power supply.

In another embodiment, the memory chip 100 and the temperature detection unit 111 may also be electrically connected with the control chip 120 through metal leads (formed by means of a lead bonding process).

Further, the A/D conversion module 112 includes a resistor unit and multiple comparison units Px.

The resistor unit is provided with a first end and a second end. The first end of the resistor unit is electrically connected with a power supply. The resistor unit and the temperature detection unit 111 may use the same power supply, or may use different power supplies. For example, if the A/D conversion module 112 is disposed in the memory chip 100, the first end of the resistor unit and the temperature detection unit 111 may use the same power supply Vtemp. If the A/D conversion module 112 is disposed in the control chip 120, the first end of the resistor unit and the temperature detection unit 111 may use different power supplies, and the resistor unit may use a power supply VDD. The second end of the resistor unit is electrically connected with the grounding terminal VSS. The resistor unit is provided with multiple leading-out terminals Ax, and the voltages of the respective leading-out terminals Ax are different from each other.

In the present embodiment, the resistor unit includes multiple sub-resistors Rx connected in series, and the numbers of the sub-resistors Rx between the respective leading-out terminals Ax of the resistor unit and the second end of the resistor unit are different from each other, so that the voltages of the respective leading-out terminals Ax are different from each other. For example, a sub-resistor R1 is arranged between a leading-out terminal A1 and the second end of the resistor unit, and sub-resistors R1 and R2 are arranged between a leading-out terminal A2 and the second end of the resistor unit, so that the voltages of the leading-out terminal A1 and the leading-out terminal A2 are different from each other.

The numbers of the sub-resistors Rx between the respective leading-out terminals Ax of the resistor unit and the second end of the resistor unit are progressively increased by a preset value, where the preset value may be a fixed value or a variable value.

Referring to FIG. 2, in the present embodiment, the numbers of the sub-resistors Rx between the respective leading-out terminals Ax of the resistor unit and the second end of the resistor unit are progressively increased by a fixed value 1. In other embodiments of the disclosure, the numbers may also be progressively increased by a fixed value 2 and the like.

When the preset value is a variable value, the preset value has a changing trend. The changing trend is set according to the voltage increase amplitude of the leading-out terminals Ax. For example, if the voltage increase amplitude of the leading-out terminals Ax is increasing, the changing trend of the preset value is increasing; if the voltage increase amplitude of the leading-out terminals Ax is decreasing, the changing trend of the preset value is decreasing; and if the voltage increase amplitude of the leading-out terminals Ax is increasing and then decreasing, the changing trend of the preset value is increasing and then decreasing. Further, the resistance values of the respective sub-resistors Rx are the same or different from each other, so that the change of the voltage increase amplitude of the leading-out terminals Ax is consistent or inconsistent. If the resistance values of the sub-resistors Rx are the same, the layout difficulty may be simplified, and the disclosure is simple and easy to implement and is convenient to manufacture.

Signals of the input end of the A/D conversion module serve as input signals of the comparison units Px, that is, analog signals output by the temperature detection unit serve as input signals of the comparison units Px. Signals of the respective multiple leading-out terminals Ax of the resistor unit serve as reference signals of the respective multiple comparison units Px. The leading-out terminals Ax and the comparison units Px have a one-to-one correspondence relationship. For example, a signal of the leading-out terminal A1 serves as a reference signal of the comparison unit P1, a signal of the leading-out terminal A2 serves as a reference signal of the comparison unit P2, and by analogy, the leading-out terminals Ax and the comparison units Px have a one-to-one correspondence relationship. The comparison units Px output digital signals. According to the digital signals output by the comparison units Px, the temperature of the memory chip 100, detected by the temperature detection unit 111, may be obtained.

When the numbers of the sub-resistors Rx between the respective leading-out terminals Ax of the resistor unit and the second end of the resistor unit are progressively increased by a variable preset value, the voltages of the respective leading-out terminals Ax are changed non-uniformly, so that the reference signals of the respective multiple comparison units Px are changed non-uniformly. Therefore, in different voltage regions, the increase amplitudes of the reference signals of the respective comparison units Px are different from each other, so as to change the measurement accuracy of the voltage regions. Specifically, for the voltage region that needs to be accurately measured, the preset value is changed in a small amplitude, so that the increase amplitude of the reference signals is small, the number of signal sampling points is increased, and thus the measurement accuracy of this region is improved. For the voltage region that does not need to be accurately measured, the preset value is changed in a large amplitude, so that the increase amplitude of the reference signal S is large, the number of signal sampling points is reduced, and thus the measurement efficiency is improved. For example, in an embodiment of the disclosure, the voltage region that needs to be accurately measured is 1.2 V to 1.7 V, and the corresponding reference signal range is 1.2 V to 1.7 V. In the voltage region in which the voltage is 1.2 V to 1.7 V, the increase amplitude of the preset value is small, for example, the increase amplitude of the preset value is 1, so that the increase amplitude of the reference signals is 0.1 V. Therefore, the number of sampling points in this voltage region may be increased, and the measurement accuracy is improved. In the voltage region in which the voltage is less than 1.2 V and voltage region in which the voltage is greater than 1.7 V, the increase amplitude of the preset value is large, for example, the increase amplitude of the preset value is 3, so that the increase amplitude of the reference signal is 0.3 V. Therefore, the number of sampling points is appropriately reduced, and the measurement efficiency is improved. Further, the A/D conversion module 112 further includes an output unit 1120, and the output unit 1120 is connected with the comparison units Px and is configured to output the digital signals. Further, in the present embodiment, the A/D conversion module 112 further includes an encoding unit EEC, the encoding unit EEC receives and encodes the digital signals output by the comparison units Px, the formed signals are input into the output unit 1120, and the output unit 1120 outputs the encoded digital signals.

In the semiconductor device of the disclosure, the temperature detection module is configured to detect the temperature of the memory chip. When the temperature detected by the temperature detection module reaches the set threshold, or after the temperature of the memory chip 100 reaches the set threshold, the memory chip is enabled, and the temperature detected by the temperature detection module provides a reference for enabling and running the memory chip, thereby preventing the memory chip from being enabled and run at a low temperature, shortening the writing time, and improving the writing stability of the memory chip.

If the memory chip 100 in a low-temperature environment is heated, the temperature of the memory chip 100 may be increased rapidly, thereby accelerating enabling of the memory chip 100. Therefore, in the disclosure, the control chip 120 may also be enabled before the memory chip 100 is enabled, and the control chip 120 heats the memory chip 100 by use of heat generated by the control chip 120 itself after being enabled to increase the temperature of the memory chip 100 rapidly.

After the control chip 120 is enabled, the control chip 120 controls the temperature detection unit 111 to be enabled to detect the temperature of the memory chip 100. The temperature detection unit 111 may further send the detected temperature to the control chip 120 as data of the control chip 120.

The control chip 120 may judge whether the temperature detected by the temperature detection unit 111 reaches the set threshold, and control the memory chip 100 to be enabled if the temperature reaches the set threshold.

If there is only one temperature detection unit 111 and one memory chip 100, and the one temperature detection unit 111 is only configured to detect the temperature of the one memory chip 100, when the control chip 120 judges that the temperature detected by the temperature detection unit 111 reaches the set threshold, the control chip 120 controls the memory chip 100 to be enabled.

If there is one temperature detection unit 111 and multiple memory chips 100, and the temperature detection unit 111 detects temperatures of the multiple memory chips 100, when the control chip 120 judges that the temperatures detected by the temperature detection unit 111 reach the set threshold, the control chip 120 controls the memory chip 100 closest to the control chip 120 to be enabled at first, and then controls the other memory chips 100 above the enabled memory chip to be sequentially enabled.

If there are multiple temperature detection units 111 and multiple memory chips 100, and there may be a case that one temperature detection unit 111 detects a temperature of only one memory chip 100 and one temperature detection unit 111 detects temperatures of the multiple memory chips 100, or there is only a case that one temperature detection unit 111 detects the temperatures of the multiple memory chips 100, the control chip 120, when judging that a temperature detected by a certain temperature detection unit 111 reaches the set threshold, controls the memory chip 100 corresponding to the temperature detection unit 111 to be enabled; and controls the memory chip 100 closest to the control chip 120 to be enabled at first and then controls the other memory chips 100 above the enabled memory chip to be sequentially enabled, if the temperature detection unit 111 detects temperatures of multiple memory chips 100.

If there are multiple temperature detection units 111 and multiple memory chips 100, and each of the temperature detection units 111 corresponds to the respective one of the memory chips 100, the control chip 120, when judging that a temperature detected by a certain temperature detection unit 111 reaches the set threshold, controls the memory chip 100 corresponding to the temperature detection unit 111 to be enabled. Specifically, the stacked structure shown in FIG. 1 includes four memory chips 100, and there is a respective temperature detection unit 111 in each memory chip 100. In such case, each temperature detection unit 111 may detect a temperature of the respective memory chip 100, so that four detected temperature values are obtained. The control chip 120 may sequentially judge whether the temperatures detected by the four temperature detection units 111 reach the set threshold, and if the temperature detected by a certain temperature detection unit 111 reaches the set threshold, the control chip 120 controls the memory chip corresponding to the temperature detection unit 111 to be enabled. For example, when the temperature detected by the temperature detection unit 111 in the bottom memory chip 100 in the stacked structure reaches the set threshold at first, the control chip 120 may control the bottom memory chip 100 in the stacked structure to be enabled at first. Then, when the temperature detected by the temperature detection unit 111 corresponding to the second last memory chip 100 in the stacked structure also reaches the set threshold, a control unit 301 controls the second last memory chip 100 in the stacked structure to be enabled. The other two memory chips 100 above the enabled memory chips are enabled in the same manner.

When the semiconductor device includes multiple memory chips 100, through the abovementioned control structure and control manner, the accuracy of enabling time of each memory chip 100 may further be improved, writing time for writing data into each memory chip 100 in a low-temperature environment may further be shortened, and the writing stability of each memory chip 100 is further improved.

When the semiconductor device of the disclosure works in a low-temperature environment, the memory chip 100 may be heated to the set threshold through the control chip 120, so that resistance of the bit line, word line and metal connecting wire (metal contact portion) in the memory chip 100 may be prevented from being increased due to the low ambient temperature. Therefore, the writing time for writing data into the memory chip in the low-temperature environment is further shortened, and the writing stability of the memory chip is improved. The set threshold may be set in the control chip 120. A specific magnitude of the set threshold may be set according to a practical requirement or experiences.

In another embodiment, there may be an additional heating circuit (not shown in the figure) in the control chip 120. The heating circuit is configured to heat the memory chip 100. Before or after the control chip 120 heats the memory chip 100, the control chip 120 judges whether the temperature, detected by the temperature detection unit 111, of the memory chip 100 reaches the set threshold. If the temperature does not reach the set threshold, the control chip 120 controls the heating circuit to heat the memory chip 100, and if the temperature reaches the set threshold, the control chip 120 controls the heating circuit to stop heating the memory chip 100. Therefore, a heating process may be controlled accurately to keep the temperature of the memory chip 100 nearby the set threshold to prevent the temperature of the memory chip 100 from being excessively high or low, such that the writing time of the memory is always relatively short.

The above is only the preferred implementation mode of the disclosure. It should be pointed out that those of ordinary skill in the art may further make a plurality of improvements and embellishments without departing from the principle of the disclosure, and these improvements and embellishments shall also fall within the scope of protection of the disclosure.

The invention claimed is:

1. A semiconductor device, comprising a memory chip and a temperature detector, the temperature detector being configured to detect a temperature of the memory chip, the temperature detector comprising:
a temperature detection assembly, wherein the temperature detection assembly comprises a temperature sensitive component and an adjustable resistor component, an electrical conductivity of the temperature sensitive component changes with the change of temperature, and the adjustable resistor component is connected in parallel with the temperature sensitive component,
wherein the temperature detection assembly is configured to be calibrated by adjusting a resistance value of the adjustable resistor component.

2. The semiconductor device of claim 1, wherein the adjustable resistor component comprises multiple sub-resistors and multiple switches, the sub-resistors are connected in series, each of the switches is connected in parallel with at least one of the sub-resistors, and the resistance value of the adjustable resistor component is changed by changing switching-on and switching-off of the multiple switches.

3. The semiconductor device of claim 2, wherein resistance values of the sub-resistors are the same.

4. The semiconductor device of claim 2, wherein each of the sub-resistors is a polysilicon resistor or a N-type diffused resistor or a P-type diffused resistor.

5. The semiconductor device of claim 2, wherein the sub-resistors are electrically connected with each other through a first layer of metal wires, and the sub-resistors are electrically connected with the switches through a second layer of metal wires.

6. The semiconductor device of claim 2, wherein the temperature detection assembly further comprises a fixed resistor, the fixed resistor is connected in series with the temperature sensitive component, the fixed resistor is provided with a first end and a second end, the first end of the fixed resistor is electrically connected with a power supply, and the second end of the fixed resistor is electrically connected with the temperature sensitive component.

7. The semiconductor device of claim 6, wherein the temperature sensitive component is a diode, a positive end of the diode is electrically connected with the second end of the fixed resistor, and a negative end of the diode is electrically connected with a grounding terminal.

8. The semiconductor device of claim 7, wherein the adjustable resistor component comprises a first end and a second end, the sub-resistors are disposed between the first end of the adjustable resistor component and the second end of the adjustable resistor component, the first end of the adjustable resistor component is electrically connected with the grounding terminal, and the second end of the adjustable resistor component is electrically connected with the second end of the fixed resistor.

9. The semiconductor device of claim 6, wherein the temperature detector further comprises an Analog/Digital (A/D) convertor having an input end and an output end, the input end is electrically connected with the second end of the fixed resistor, the output end outputs digital signals, and the A/D convertor is configured to convert analog signals of the second end of the fixed resistor into digital signals.

10. The semiconductor device of claim 9, wherein the A/D convertor comprises:
a resistor assembly provided with a first end and a second end, wherein the first end of the resistor assembly is electrically connected with a power supply, the second end of the resistor assembly is electrically connected with a grounding terminal, the resistor assembly is provided with multiple leading-out terminals, and voltages of respective leading-out terminals are different from each other; and
multiple comparators, wherein signals of the input end of the A/D convertor serve as input signals of the comparators, signals of the respective multiple leading-out terminals of the resistor assembly serve as reference signals of the respective multiple comparators, and the comparators output digital signals.

11. The semiconductor device of claim 10, wherein the A/D convertor further comprises an encoding component, and the encoding component receives and encodes the digital signals of the comparators.

12. The semiconductor device of claim 10, wherein the A/D convertor further comprises an output component, and the output component is connected with the comparators to output the digital signals.

13. The semiconductor device of claim 10, wherein the resistor assembly comprises multiple sub-resistors connected in series, and the numbers of the sub-resistors between the respective leading-out terminals of the resistor assembly and the second end of the resistor assembly are different from each other, so that the voltages of the respective leading-out terminals are different from each other.

14. The semiconductor device of claim 13, wherein resistance values of the respective sub-resistors are the same or different from each other.

15. The semiconductor device of claim 13, wherein the numbers of the sub-resistors between the respective leading-out terminals of the resistor assembly and the second end of the resistor assembly are progressively increased by a preset value.

16. The semiconductor device of claim 13, wherein each of the sub-resistors is at least one of a polysilicon resistor, a N-type diffused resistor or a P-type diffused resistor.

17. The semiconductor device of claim 15, wherein the sub-resistors are electrically connected with each other through a first layer of metal wires, and the resistor assembly forms the leading-out terminals through a second layer of metal wires.

18. The semiconductor device of claim 1, wherein the temperature detection assembly and the memory chip are powered by different power supplies.

19. The semiconductor device of claim 17, wherein the temperature detection assembly is powered earlier than the memory chip.

20. The semiconductor device of claim 1, wherein the semiconductor device further comprises a control chip, and the memory chip and the temperature detector are electrically connected with the control chip.

* * * * *